(12) United States Patent
Kitagawa et al.

(10) Patent No.: US 10,770,143 B2
(45) Date of Patent: Sep. 8, 2020

(54) MEMORY SYSTEMS AND MEMORY PROGRAMMING METHODS

(71) Applicant: Micron Technology, Inc., Boise, ID (US)

(72) Inventors: Makoto Kitagawa, Boise, ID (US); Adam Johnson, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/235,497

(22) Filed: Dec. 28, 2018

(65) Prior Publication Data

US 2019/0139606 A1 May 9, 2019

Related U.S. Application Data

(63) Continuation of application No. 14/137,586, filed on Dec. 20, 2013, now Pat. No. 10,176,868.

(51) Int. Cl.
*G11C 13/00* (2006.01)
*G11C 11/16* (2006.01)

(52) U.S. Cl.
CPC ...... *G11C 13/0069* (2013.01); *G11C 13/0026* (2013.01); *G11C 13/0033* (2013.01); *G11C 11/1655* (2013.01); *G11C 11/1675* (2013.01); *G11C 13/0004* (2013.01); *G11C 13/0007* (2013.01); *G11C 13/0011* (2013.01); *G11C 2213/79* (2013.01)

(58) Field of Classification Search
CPC ............ G11C 13/0069; G11C 13/0004; G11C 13/0007

USPC ........................................................ 365/148
See application file for complete search history.

(56) References Cited

U.S. PATENT DOCUMENTS

| 6,137,716 A | 10/2000 | Wik |
| 6,381,670 B1 | 4/2002 | Lee et al. |
| 6,392,916 B1 | 5/2002 | Choi et al. |
| 6,879,525 B2 | 4/2005 | Van Brocklin et al. |
| 7,006,384 B2 | 2/2006 | Banks |
| 7,206,225 B2 | 4/2007 | Wu |

(Continued)

*Primary Examiner* — Jason Lappas
(74) *Attorney, Agent, or Firm* — Wells St. John P.S.

(57) ABSTRACT

Memory systems and memory programming methods are described. According to one arrangement, a memory system includes a plurality of memory cells individually configured to have a plurality of different memory states, a plurality of bitlines coupled with the memory cells, access circuitry coupled with the bitlines and configured to apply a plurality of program signals to the bitlines to program the memory cells between the different memory states, a controller configured to control the access circuitry to provide a first program signal and a second program signal to one of the bitlines coupled with one of the memory cells to program the one memory cell from a first of the memory states to a second of the memory states, wherein the second program signal has an increased electrical characteristic compared with the first program signal, and selection circuitry configure to couple another of the bitlines which is immediately adjacent to the one bitline to a node having a first voltage which is different than a second voltage of the one bitline during the provision of the first and second program signals to the one bitline.

12 Claims, 5 Drawing Sheets

(56) References Cited

U.S. PATENT DOCUMENTS

| | | | |
|---|---|---|---|
| 7,382,647 B1 * | 6/2008 | Gopalakrishnan | ............................ G11C 13/0007 365/100 |
| 8,426,306 B1 * | 4/2013 | Gee | ........................ H01L 45/085 257/2 |
| 8,467,226 B2 | 6/2013 | Bedeschi et al. | |
| 8,830,753 B2 | 9/2014 | Kim | |
| 8,854,872 B2 | 10/2014 | Lam et al. | |
| 8,923,056 B2 | 12/2014 | Kim | |
| 8,971,088 B1 | 3/2015 | Jo et al. | |
| 9,123,414 B2 | 9/2015 | Kitagawa et al. | |
| 9,230,685 B2 | 1/2016 | Strand et al. | |
| 9,269,432 B2 | 2/2016 | Faraoni et al. | |
| 9,336,875 B2 | 5/2016 | Fackenthal et al. | |
| 9,633,728 B2 | 4/2017 | Kitagawa et al. | |
| 9,773,551 B2 | 9/2017 | Strand et al. | |
| 9,837,151 B2 | 12/2017 | Fackenthal et al. | |
| 10,121,539 B2 | 11/2018 | Kitagawa et al. | |
| 10,147,486 B2 | 12/2018 | Faraoni et al. | |
| 10,176,868 B2 * | 1/2019 | Kitagawa | ............ G11C 13/0069 |
| 10,304,531 B2 | 5/2019 | Strand et al. | |
| 10,311,953 B2 | 6/2019 | Fackenthal et al. | |
| 2008/0080238 A1 | 4/2008 | Yuda | |
| 2012/0230085 A1 | 9/2012 | Kawai et al. | |
| 2013/0148409 A1 * | 6/2013 | Chung | .................... G11C 17/18 365/148 |
| 2013/0201750 A1 | 8/2013 | Lee et al. | |
| 2013/0250654 A1 | 9/2013 | Sugimae et al. | |
| 2013/0250657 A1 | 9/2013 | Haukness et al. | |
| 2014/0112054 A1 | 4/2014 | Shimakawa et al. | |
| 2014/0268897 A1 | 9/2014 | Nazarian et al. | |
| 2014/0268989 A1 * | 9/2014 | Hong | ................. G11C 13/0002 365/148 |
| 2014/0268990 A1 * | 9/2014 | Hong | ................. G11C 13/0004 365/148 |
| 2014/0268997 A1 * | 9/2014 | Nazarian | ............ G11C 13/0069 365/148 |
| 2014/0312296 A1 * | 10/2014 | Jo | ....................... G11C 13/0007 257/4 |
| 2015/0179256 A1 | 6/2015 | Kitagawa et al. | |
| 2019/0279714 A1 | 9/2019 | Fackenthal et al. | |

\* cited by examiner

MEMORY SYSTEMS AND MEMORY PROGRAMMING METHODS

RELATED PATENT DATA

This application is a continuation of and claims priority to U.S. patent application Ser. No. 14/137,586, which was filed Dec. 20, 2013, the teachings of which are incorporated herein by reference.

TECHNICAL FIELD

Embodiments disclosed herein pertain to memory systems and memory programming methods.

BACKGROUND

Memory devices are widely used in electronic devices, such as computers, digital cameras, personal audio and video players, appliances, vehicles, etc. for storing digital information. Many different types of memory are available, using different fundamental technologies for storing data, and the memory may be volatile or non-volatile memory.

Memory cells of memory are programmed to have different states to store the digital information. Program signals may be applied to the memory cells to change the memory cells from one memory state to another different memory state. The memory states of the memory cells may be subsequently read to access the stored digital information.

At least some example embodiments described below are directed towards memory systems and memory programming methods.

DETAILED DESCRIPTION OF EXAMPLE EMBODIMENTS

Figure 1:
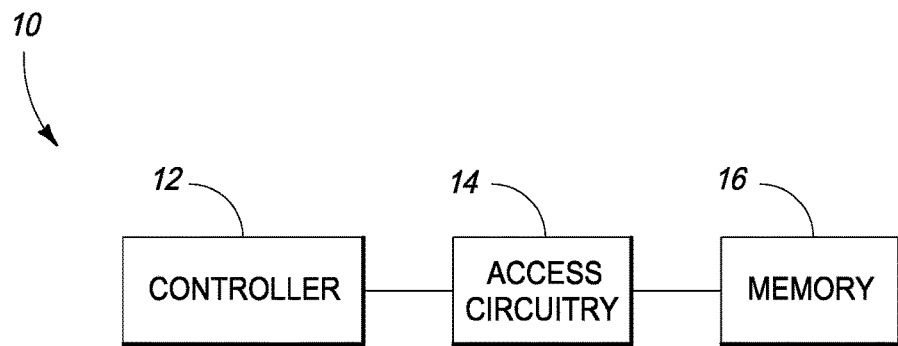
FIG. 1 is a functional block diagram of a memory system according to one embodiment.

Referring to FIG. 1, a functional block diagram of a memory system 10 is shown according to one embodiment. The illustrated memory system 10 includes a controller 12, access circuitry 14, and memory 16. Memory system 10 may be implemented within or with respect to various associated devices (not shown), such as computers, cameras, media players, and thumb drives, in some examples. Memory system 10 stores data generated or utilized by the associated devices in the described examples. Other embodiments of memory system 10 are possible and may include more, less and/or alternative components or circuitry.

Controller 12 controls operations of writing, reading and re-writing data of memory 16 as well as interfacing with other components or circuitry, such as sources of data to be stored within memory 16. Controller 12 may access, process and generate commands with respect to memory 16 during operations of an associated device. Example commands instruct the generation of program signals (e.g., reset and set program signals) which are applied to memory 16 in one embodiment. The program signals are used to write data to memory (i.e., program the memory) during programming operations in one embodiment. Controller 12 may also control the application of read and verify pulses to memory 16 to read and verify stored data in one embodiment.

In one embodiment, controller 12 comprises processing circuitry configured to execute programming provided by appropriate computer-readable storage media (e.g., memory) in at least one embodiment. For example, the controller 12 may be implemented as one or more processor(s) and/or other structure configured to execute executable instructions including, for example, software and/or firmware instructions. Other example embodiments of controller 12 may include hardware logic, PGA, FPGA, ASIC, state machines, and/or other structures alone or in combination with one or more processor(s). These examples of controller 12 are for illustration and other configurations are possible.

Access circuitry 14 is coupled with controller 12 and memory 16 and is configured to implement addressing (selection of columns and rows of memory 16), programming/writing, reading, verifying and re-writing operations with respect to memory cells of memory 16 in one embodiment. For example, access circuitry 14 may receive instructions from controller 12 to select a specific block, page, word or byte of the memory 16 as well as to implement programming, reading, verifying and re-writing with respect to a plurality of cells of the selected block, page, word or byte. As discussed below, the access circuitry 14 may apply program signals including appropriate voltage potentials to the memory 16 to perform programming operations in one embodiment.

Memory 16 includes a plurality of memory cells configured to store data, conductors electrically connected with the memory cells, and perhaps additional circuitry, for example circuits of the access circuitry 14. At least some of the memory cells are individually capable of being programmed to a plurality of different memory states at a plurality of moments in time. Memory 16 is accessible to the user and/or associated device for storage of digital information.

Memory 16 may be implemented in different arrangements in different embodiments. For example, the memory 16 may be implemented within a memory device, such as a chip, a portion of the chip (e.g., tiles and/or sub-tiles discussed below) or other arrangements. The memory device may also include controller 12 and/or access circuitry 14 or portions thereof.

Figure 2:
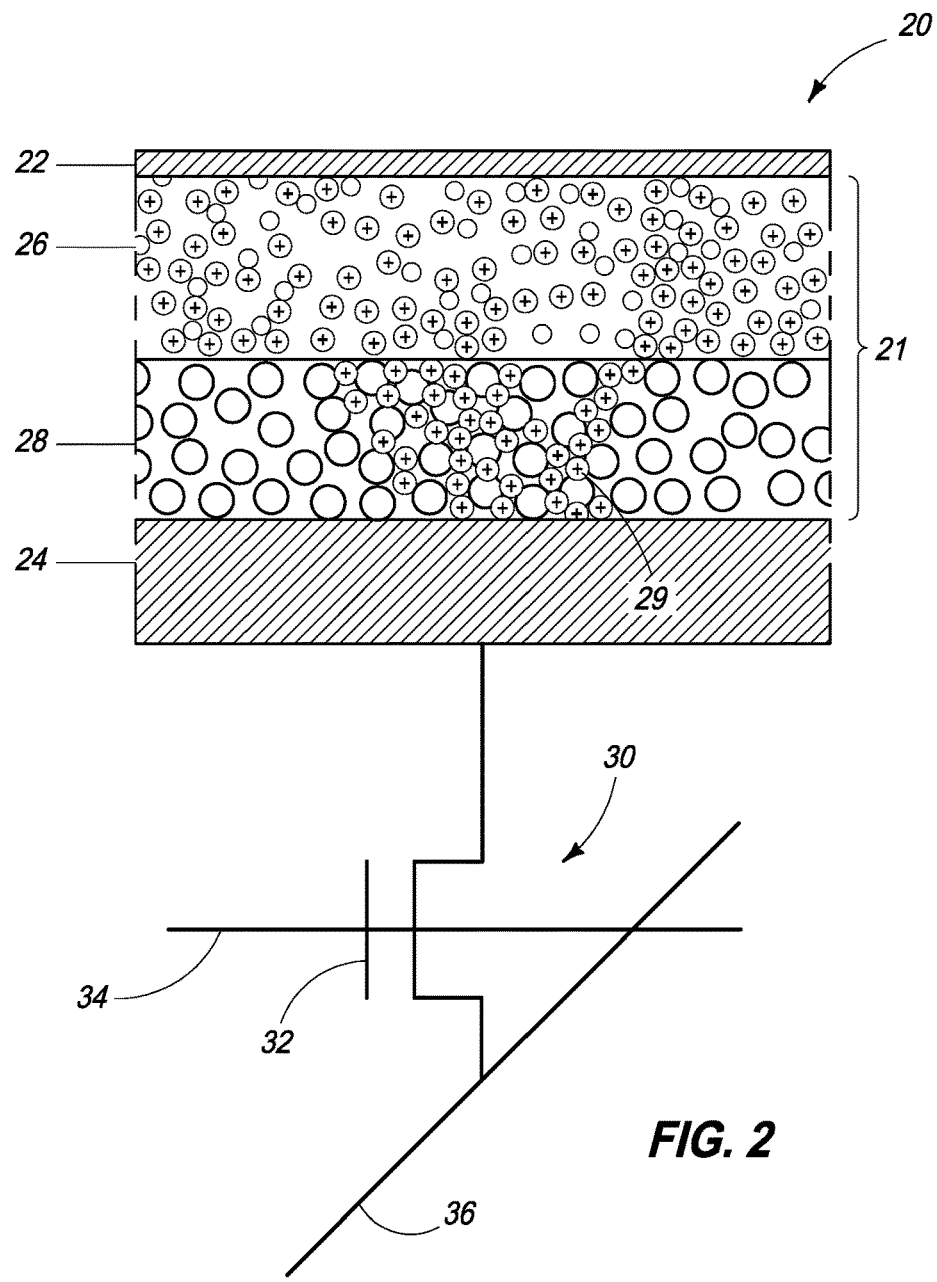
FIG. 2 is an illustrative representation of a memory cell according to one embodiment.

Referring to FIG. 2, an example of a memory cell 20 of memory 16 is shown. The illustrated example memory cell 20 is a resistive random access memory (ReRAM) cell configured to have different electrical resistances in different memory states. The different memory states of the memory cells 20 may be read by sensing currents passing through the memory cells 20. More specifically, the illustrated memory cell 20 is a one transistor/one resistor (1T1R) conductive bridge random access memory CBRAM memory cell in the depicted embodiment.

Other types of memory cells may be utilized in other embodiments including, for example, phase-change memory (PCM) cells, magnetoresistive random access memory (MRAM) cells, and spin transfer torque magnetic random access memory (Spin RAM) cells. In addition, memory cells having different configurations may also be utilized in other embodiments including, for example, one transistor (1T) cells, one resistor (1R) cells and one diode/one resistor (1D1R) cells.

The example CBRAM memory cell 20 of FIG. 2 includes a first electrode 22, memory element 21 and second electrode 24, and the electrodes 22, 24 comprise electrically conductive material. The illustrated embodiment of memory element 21 includes an electrically conductive source layer 26 and a dielectric layer 28 intermediate the electrodes 22, 24. In one embodiment, the source layer 26 is a Cu+ source layer (e.g., CuTe), example materials of the dielectric layer 28 include AlOx, HfOx, and ZrOx, and the bottom electrode 24 is titanium nitride (TiN). Other embodiments are possible. Electrode 22 is coupled with or is a part of a plate. The plate may also be referred to as a conductive common source line (CSL) or node and which may have different voltages during programming of the memory cells 20.

The memory cell 20 shown in FIG. 2 includes one or more electrically conductive structures 29 (e.g., filaments) in a low resistance state which may correspond to one of a plurality of different memory states (e.g., a "one" or "zero" in an example binary application) of the memory cell 20. The memory cell 20 may also be programmed to a high resistance state where the conductive structures 29 are removed and not present and which may correspond to another of the different memory states. The presence of the structures 29 provides the memory element 21 in a low resistance state due to the lowered electrical resistance through dielectric layer 28 provided via the structures 29. Program signals having different write voltage potentials may be applied across the electrodes 22, 24 to change the resistance (and memory state) of the memory cell 20.

More specifically, a set programming operation may be performed by the application of a voltage potential/bias to electrode 22 which is more positive than the voltage potential/bias applied to electrode 24. The application of these signals causes inducement of Cu ions into dielectric layer 28 and formation of one or more electrically conductive structures 29 (e.g., filaments) through dielectric layer 28 and between conductive source layer 26 and electrode 24. The formation of the structures 29 provides the memory cell 25 in a low resistance state. In one embodiment, the structures 29 comprise material (e.g., copper) from the source layer 26.

A memory cell 20 having the conductive structures 29 may be programmed in a reset operation to a high resistance state by the application of a voltage potential/bias to electrode 24 which is more positive than the voltage potential/ bias applied to electrode 22. The application of these signals cause Cu ions to return into source layer 26 and dissolves any electrically conductive structures 29 within dielectric layer 28, thereby increasing the electrical resistance of the memory element 21 between the electrodes 22, 24 and providing the memory cell 20 in a high resistance state.

Memory cell 20 may be repeatedly programmed between the high and low resistance arrangements at different moments in time to store different data values corresponding to the different memory (e.g., resistive) states. In one embodiment, a current is passed through the memory cell 20 and sense circuitry may measure the current to determine the resistance and memory state of the memory cell 20 during an example read operation.

FIG. 2 also illustrates an access transistor 30 (e.g., NMOS) having a gate 32 coupled with a word line 34 and plural terminals coupled with electrode 24 and a bit line 36. Word line 34 is used to select the memory cell 20 for programming/reading/verification and bit line 36 is used to conduct appropriate signals for the programming/reading/ verification of the memory cell 20. Access transistor 30 may be part of access circuitry 14 in one embodiment.

Figure 3:
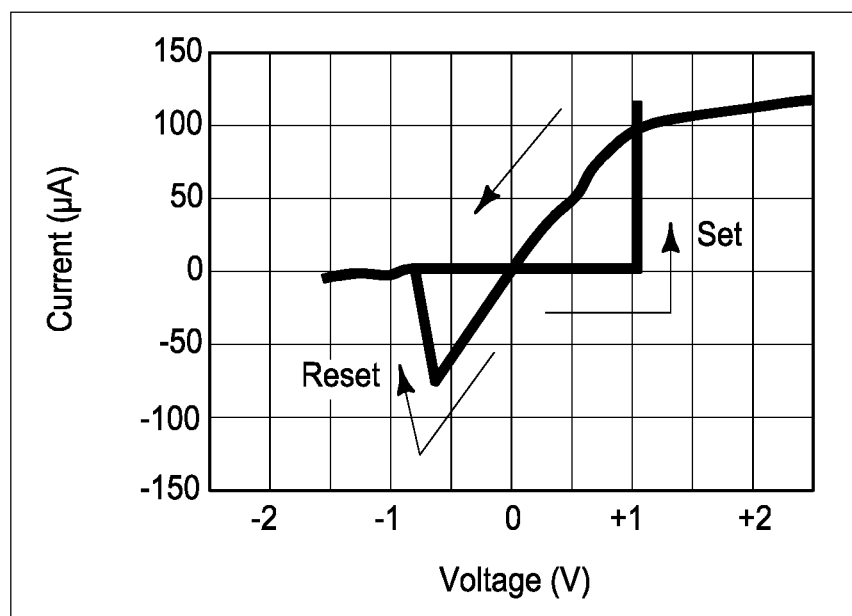
FIG. 3 is a graphical representation of plural memory states of a memory cell according to one embodiment.

FIG. 3 illustrates an IV curve of an example 50 nm CBRAM memory cell 20 in a voltage sweeping mode wherein the voltage polarity across the cell in a set/reset operation is defined as plus/minus, respectively. As shown, the memory cell is provided in a high resistive state (HRS) during a reset operation and is provided in a low resistive state (LRS) during a set operation.

Figure 4:
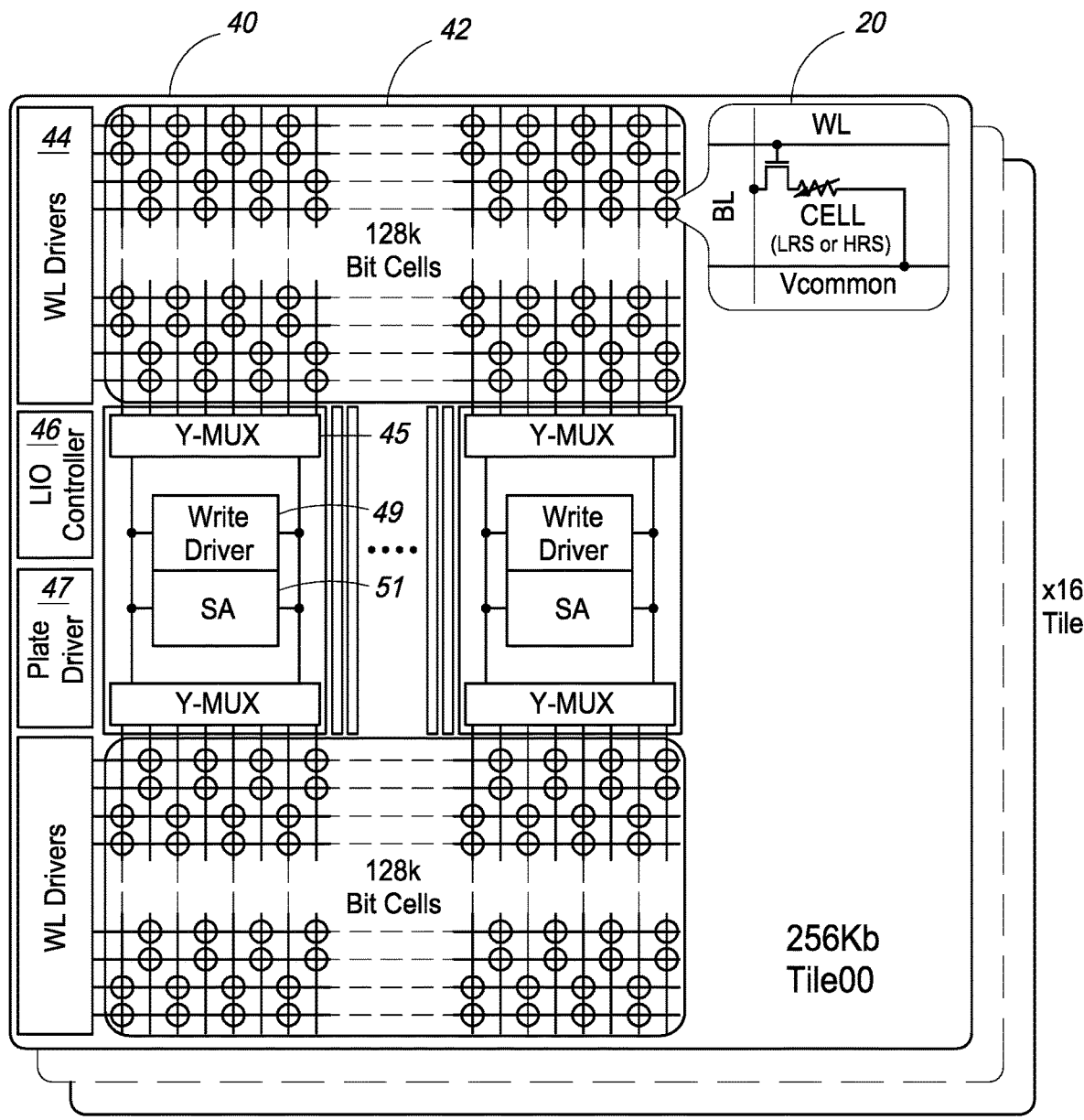
FIG. 4 is an illustrative representation of a tile of a memory chip according to one embodiment.

Referring to FIG. 4, a tile 40 of a memory device is shown according to one embodiment. The memory device may comprise a memory chip in one embodiment and which may include a plurality of tiles 40 (e.g., 16 tiles in the illustrated example).

The depicted tile 40 includes a memory array 42 of a plurality of memory cells 20 which may be individually addressed by WL drivers 44 and Y-MUX circuitry 45. The tile 40 additionally includes an LIO controller 46, Vcommon plate driver 47, write driver 49 and a sense amplifier 51 in the illustrated embodiment. Tile 40 includes sixty-four of individual circuits 45, 49 and 51 to interface with a plurality of memory cells 20 of array 42 in parallel in one embodiment. LIO controller 46 provides interfacing of the sense amplifiers 51 of a given bank of the tile 40 to a databus (not shown) which is shared between multiple banks and also interfaces with an I/O block of the memory chip. Plate driver 47 drives the plate voltage to the various voltage values utilized for reading and writing. The write driver 49 provides program signals which drive the bitline voltage to the various voltage values utilized for writing. Sense amplifiers 51 sense the memory states of memory cells 20 during read and verification operations.

Figure 5:
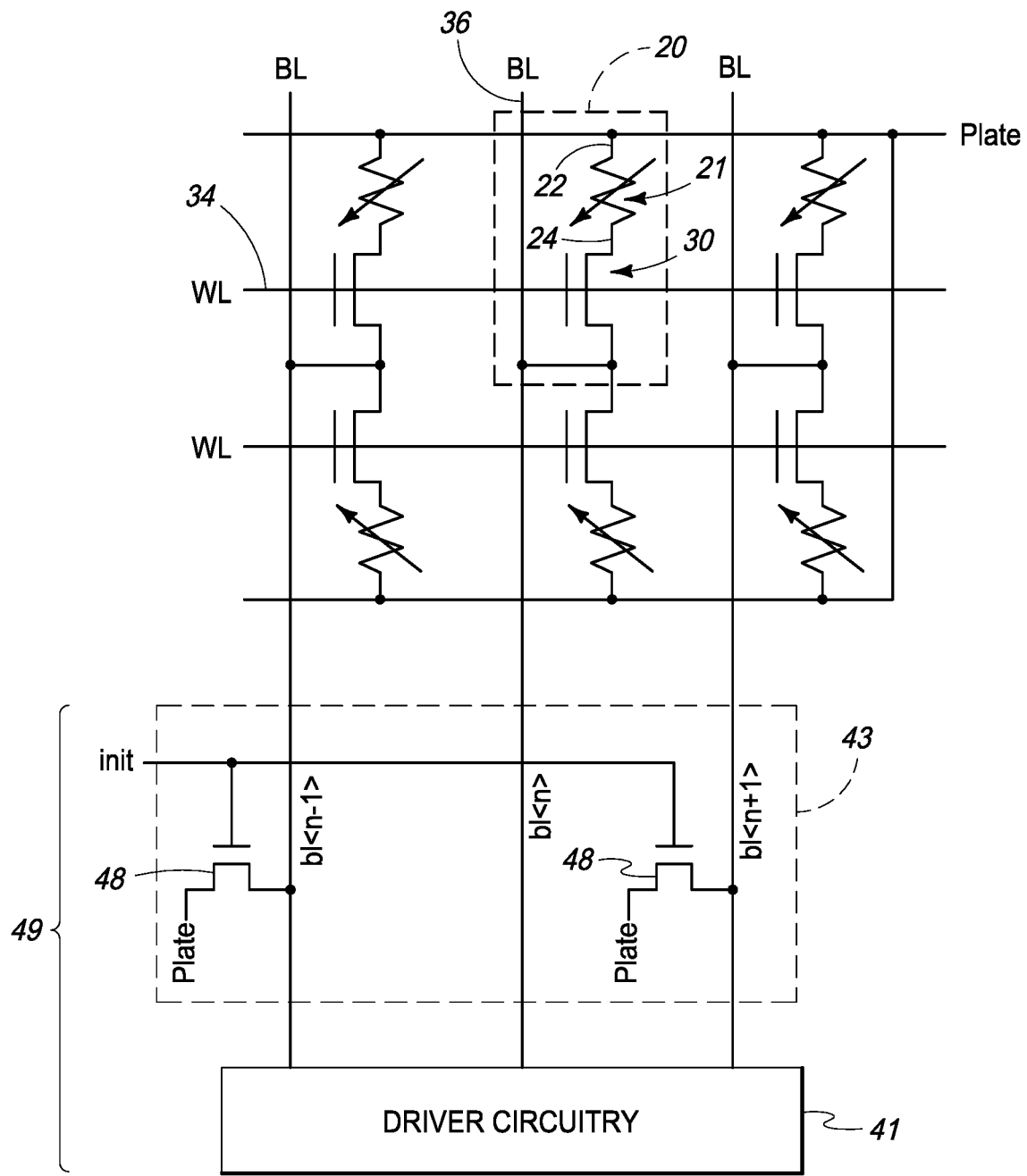
FIG. 5 is a schematic representation of a plurality of memory cells and associated circuitry according to one embodiment.

Referring to FIG. 5, a plurality of memory cells 20 are coupled with a plurality of wordlines 34, bitlines 36, and the plate. In addition, the bitlines 36 are coupled with circuitry of write driver 49 which is configured to program the memory cells 20 into different memory states as described further below.

In one embodiment, the illustrated write driver 49 is circuitry of the access circuitry 14 described with respect to FIG. 1. The example write driver 49 includes driver circuitry 41 and selection circuitry 43 in the illustrated arrangement. Driver circuitry 41 is configured to generate and apply program signals to bitlines 36 to program the memory states of the memory cells 20.

The bitlines 36 are implemented as a plurality of parallel conductors in the depicted embodiment. The program signals applied to the bitlines 36 have different voltages and example apparatus and methods described below are configured and implemented to program a given memory cell 20 while reducing capacitive effects of the programming upon adjacent bitlines and memory cells (i.e., cross-talk) as discussed in detail below and which may otherwise disturb the memory states of the adjacent memory cells.

In the example of FIG. 5, the bitline 36 being programmed in the described embodiment is bl<n>. In this illustrated example, the bitlines 36 which are immediately adjacent to bitline bl<n> are bitlines bl<n-1> and bl<n+1>. In one embodiment, it is desired to implement programming operations with respect to bitline bl<n> without disturbing the programmed memory states of memory cells which are coupled with adjacent bitlines bl<n-1> and bl<n+1>.

The application of program signals to bitline bl<n> may result in changes to the voltage of bitline bl<n>. However, the memory cells which share the same selected wordline as the memory cell being programmed via bitline bl<n> are sensitive to the voltage fluctuations since the access transistors 30 coupled with the selected wordline are on. If a programming operation of a memory cell coupled with bitline bl<n> results in an increase in voltage of the bitline bl<n>, it is desired to maintain adjacent bitlines bl<n−1> and bl<n+1> at an initial reduced voltage corresponding to the initial voltage of bitline bl<n> to reduce cross-talk during the programming operation in one embodiment.

In one example, selection circuitry 43 is configured to short the adjacent bitlines bl<n−1> and bl<n+1> to the plate during the application of at least some of the program signals to the memory cell 20 coupled with bitline bl<n> to reduce the effects of voltage changes to bitline bl<n> upon adjacent bitlines bl<n−1> and bl<n+1>. The illustrated embodiment of selection circuitry 43 comprises a plurality of transistors 48 which are configured to selectively short the adjacent bitlines bl<n−1> and bl<n+1> to the plate responsive to an init control signal provided by controller 12.

As shown in FIG. 5, the shorting of the bitline bl<n−1> to the plate provides both of the electrodes of a respective memory cell coupled with bitline bl<n−1> (and selected by the asserted wordline) at substantially the same voltage (i.e., minus the voltage drops across the transistors 30, 48) during the programming of the memory cell 20 coupled with bitline bl<n> and reduces the effects of the voltage changes at bitline bl<n> upon adjacent bitline bl<n−1> and the respective memory cell. The application of substantially the same voltage to the opposing electrodes of the memory cell which is coupled with adjacent bitline bl<n−1> and selected by the active wordline provides substantially zero voltage potential across the memory cell during the programming of the memory cell coupled with bitline bl<n> and which does not disturb the programmed memory state of the adjacent memory cell thereby reducing cross-talk resulting from the programming. Although the above is described with respect to bitline bl<n−1>, bitline bl<n+1> may also be similarly shorted to the plate during the programming of the memory cell 20 which is coupled with bitline bl<n>.

The illustrated selection circuitry 43 is only configured to short the adjacent bitlines bl<n−1> and bl<n+1> in the illustrated embodiment. Selection circuitry 43 may include additional transistors 48 in other embodiments, for example coupled with bitline bl<n>, to selectively short bitline bl<n> to the plate during the programming of other memory cells via one or both of adjacent bitlines bl<n−1> and bl<n+1> in one embodiment.

Figure 6:
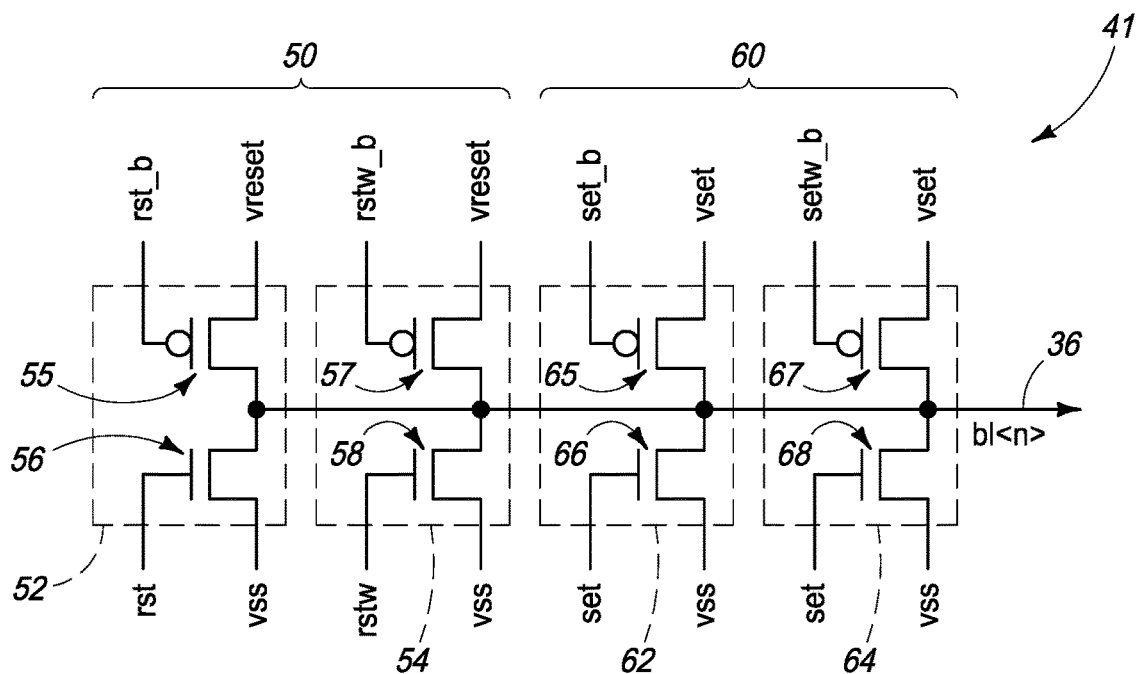
FIG. 6 is a schematic representation of driver circuitry according to one embodiment.

Referring to FIG. 6, additional details regarding an example configuration of driver circuitry 41 are shown according to one embodiment. The illustrated driver circuitry 41 is configured to provide program signals (e.g., set and reset program signals) to a respective bitline 36 (e.g., bitline bl<n> being programmed in the embodiment described above). Additional similarly configured driver circuitry 41 may be coupled with other bitlines, such as bitlines bl<n−1> and bl<n+1>, to selectively program the associated memory cells coupled with the other bitlines in one embodiment.

The driver circuitry 41 includes a reset driver circuit 50 and a set driver circuit 60 in the illustrated embodiment. Reset driver circuit 50 generates and provides reset program signals to bitline 36 to program a memory cell from the set state to the reset state and set driver circuit 60 generates and provides set program signals to bitline 36 to program a memory cell from the reset state to the set state.

Reset driver circuit 50 includes large (strong) driver circuitry 52 including plural large driver circuits 55, 56 and small (weak) driver circuitry 54 including plural small driver circuits 57, 58 in the illustrated embodiment. Similarly, set driver circuit 60 includes large driver circuitry 62 including plural large driver circuits 65, 66 and small driver circuitry 64 including plural small driver circuits 67, 68 in the illustrated embodiment.

The relative terms of large and small refer to the drive capabilities of the respective circuits in the described example embodiment. The large driver circuits 55, 56, 65, 66 have reduced impedances compared with the small driver circuits 57, 58, 67, 68 in one embodiment. In one illustrative example, the transistors of the large driver circuits 55, 56, 65, 66 individually have approximately four times the active area compared with the individual transistors of the small driver circuits 57, 58, 67, 68 to conduct increased current to the bitline.

The driver circuits 55, 57, 65, 67 are pull-up drivers which pull or maintain the bitline 36 to/at an increased voltage during programming operations while driver circuits 56, 58, 66, 68 are pull-down drivers which pull or maintain the bitline 36 to/at a decreased voltage during programming operations.

The large driver circuitry 52, 62 and small driver circuitry 54, 64 provide program signals having different electrical characteristics to bitline bl<n> in one embodiment. For example, the large driver circuitry 52, 62 source or sink increased currents with respect to the bitline 36 compared with the small driver circuitry 54, 64. The application of the program signals having different electrical characteristics enables sufficient current to be applied to the memory cells to change the memory states of the memory cells while also reducing disturbances to the memory cells coupled with the adjacent bitlines bl<n−1> and bl<n+1> in one embodiment.

In one embodiment, both of the large and small driver circuits of reset driver circuit 50 (or set driver circuit 60) are configured to implement a reset programming operation (or set programming operation) to change the state of a memory cell from the set state to the reset state (or change the state of a memory cell from the reset state to the set state).

In particular, as mentioned above, the bitlines bl<n−1> and bl<n+1> are shorted to the plate during the programming of bitline bl<n> in one embodiment. However, the transistors 48 of selection circuitry 43 individually have an impedance and the capacitance of the individual bitlines is relatively large which slows the responsiveness of transistors 48. It is possible to drive bitline bl<n> to different voltage levels relatively quickly (i.e., fast slew rate) and faster than the shorting of the adjacent bitlines bl<n−1>, bl<n+1> to the plate which may disturb the states of the memory cells coupled with adjacent bitlines bl<n−1>, bl<n+1>. Accordingly, in some embodiments described further below, the small and large driver circuits of reset driver circuit 50 (or set driver circuit 60) are used to implement a single reset (or set) programming operation. For example, only the small drivers are used to drive the bitline bl<n> at the beginning and end of a program signal applied to bitline bl<n> while the large drivers are used to switch the states of the memory cell coupled with bitline bl<n> in one embodiment.

Controller 12 controls the write driver 49 to generate the program signals which implement the programming operations (i.e., reset or set) with respect to an appropriate memory cell coupled with bitline bl<n>. In one example reset programming operation, the driver circuitry 41 is controlled such that the bitline bl<n> is only initially driven with small driver circuit 57 which slows the slew rate of the rising voltage of the bitline to enable the adjacent bitlines bl<n−1>, bl<n+1> to be shorted to the plate. After the voltage of the bitline bl<n> increases (or decreases) a sufficient amount to reduce cross-talk, then the large driver 55 drives the bitline bl<n> with a program signal with increased current to complete the reset programming operation of the described example embodiment.

The memory cell being programmed from an initial memory state to another memory state remains in the initial memory state when the bitline bl<n> is only driven by an appropriate small driver during the beginning of the programming operation. Thereafter, an appropriate large driver provides increased current to the bitline bl<n> to change the state of the memory cell from the initial memory state to the another memory state and to complete the programming operation. In one embodiment, the small driver remains on after the large driver is enabled.

Figure 7:
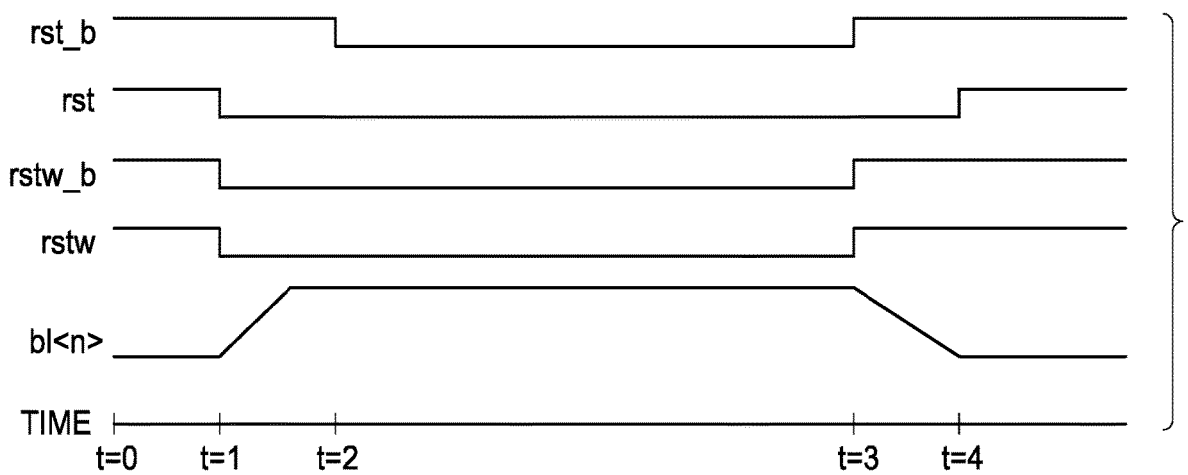
FIG. 7 is a timing diagram illustrating a plurality of signals which may be used to program a memory cell according to one embodiment.

Referring to FIG. 7, additional details regarding an example reset programming operation in accordance with the above are shown. Between time t=0 and t=1, the controller issues a reset instruction to change the memory state of a selected memory cell coupled with bitline bl<n> from a set state to a reset state. The transistors 48 of FIG. 5 of adjacent bitlines bl<n−1> and bl<n+1> may be on (i.e., shorting the adjacent bitlines bl<n−1> and bl<n+1> to the plate) or off when the reset instruction was issued. If transistors 48 of adjacent bitlines bl<n−1> and bl<n+1> are off, then they are turned on to short the adjacent bitlines bl<n−1> and bl<n+1> to the plate. Otherwise, if the transistors 48 coupled with adjacent bitlines bl<n−1> and bl<n+1> are on, then they remain on during the described reset programming operation with respect to bitline bl<n>. If the transistor 48 of bitline bl<n> was on when the reset instruction was issued, then it is provided in the off state to enable the bitline bl<n> to be driven by the driver circuitry 41.

As a result of the reset instruction, the large pull-down drive circuit 56 is disabled by signal rst at time t=1 and the large pull-up driver circuit 55 remains disabled by signal rst_b. In addition, small pull-up driver circuit 57 is enabled by signal rstw_b and small pull-down driver circuit 58 is disabled by signal rstw to initiate the reset programming operation by the application of the program signal via driver circuit 57 to bitline bl<n>.

As a result of the application of the program signal, the voltage of the bitline bl<n> rises to an appropriate voltage between times t=1 to t=2 to program the memory cell. The slew rate of the increase of the voltage shown in FIG. 7 is reduced compared with the slew rate if large driver circuit 55 were used to drive the bitline bl<n>. As discussed above, the use of small driver circuit 57 enables the transistors 48 coupled with adjacent bitlines bl<n−1> and bl<n+1> sufficient time to short the adjacent bitlines bl<n−1> and bl<n+1> to the plate to reduce cross-talk resulting from the programming operations.

At time t=2, the large driver circuit 55 is enabled which provides a program signal of increased current to bitline bl<n> compared with the current of the program signal provided by small driver circuit 57 to drive bitline bl<n>. The application of the program signal between times t=2 and t=3 using the large driver circuit 55 removes the conductive structure 29 (FIG. 2) within the memory element 21 changing the memory state of the memory cell from the low electrical resistance set state to the high electrical resistance reset state in one embodiment.

Following the change of memory state of the memory cell to the reset state, the large driver circuit 55 and small driver circuit 57 are disabled and small pull-down driver circuit 58 is enabled at time t=3. The voltage of bitline bl<n> slowly degrades following enablement of driver circuit 58. The large pull-down driver circuit 56 is enabled at time t=4 after the voltage of the bitline bl<n> has degraded a sufficient amount which reduces effects of cross-talk upon adjacent bitlines bl<n−1> and bl<n+1>.

The program signal applied between times t=1 and t=2, the program signal applied between times t=2 and t=3, and the program signal applied between times t=3 and t=4 may be referred to as different program signals or different portions of a single program signal. The adjacent bitlines bl<n−1> and bl<n+1> are shorted to the plate between times t=0 and t=4 to reduce cross-talk during the reset programming operation in one embodiment.

CONCLUSION

In some embodiments, a memory system comprises a plurality of memory cells individually configured to have a plurality of different memory states, a plurality of bitlines coupled with the memory cells, access circuitry coupled with the bitlines and configured to apply a plurality of program signals to the bitlines to program the memory cells between the different states, a controller configured to control the access circuitry to provide a first program signal and a second program signal to one of the bitlines coupled with one of the memory cells to program the one memory cell from a first of the memory states to a second of the memory states, wherein the second program signal has an increased electrical characteristic compared with the first program signal, and selection circuitry configure to couple another of the bitlines which is immediately adjacent to the one bitline to a node having a first voltage which is different than a second voltage of the one bitline during the provision of the first and second program signals to the one bitline.

In some embodiments, a memory system comprises a plurality of memory cells individually configured to have a plurality of different memory states, and access circuitry configured to implement a programming operation to program one of the memory cells from a first memory state to a second memory state, the access circuitry comprising a first driver circuit configured to apply a first program signal to the one memory cell to initiate the programming operation, and a second driver circuit configured to apply a second program signal to the one memory cell after the application of the first program signal to the one memory cell to change the one memory cell from the first memory state to the second memory state.

In some embodiments, a memory programming method comprises providing an instruction to program one of a plurality of memory cells from a first memory state to a second memory state, wherein the memory cells individually comprise a first electrode coupled with a node, as a result of the instruction, providing a plurality of program signals to a first bitline coupled with a second electrode of the one memory cell to program the one memory cell from the first memory state to the second memory state, wherein one of the program signals has an increased electrical characteristic compared with another of the program signals, and coupling a second bitline which is immediately adjacent to the first bitline to the node during the providing the plurality of program signals to the first bitline.

In some embodiments, a memory programming method comprises providing an instruction to program one of a plurality of memory cells from a first memory state to a second memory state, as a result of the instruction, first providing a first program signal to a first bitline coupled with the one memory cell to change a voltage of the first bitline from a first voltage to a second voltage, second providing a second program signal to the bitline having the second voltage to change the state of the one memory cell from the first memory state to the second memory state, and coupling a second bitline which is immediately adjacent to the first bitline with a node at the first voltage during the first and second providings.

In some embodiments, a memory programming method comprises providing an instruction to program a memory cell from a first memory state to a second memory state, as a result of the instruction, providing a plurality of program signals to a first bitline coupled with the memory cell to program the memory cell from the first memory state to the second memory state, the providing comprising first providing a first program signal to increase a voltage of the first bitline from a first voltage to a second voltage, and second providing a second program signal to provide increased current upon the first bitline compared with a current upon the bitline resulting from the first providing, and maintaining a second bitline immediately adjacent to the first bitline at the first voltage during the first and second providings.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

What is claimed is:

1. A memory system comprising:
   a plurality of memory cells individually configured to have a plurality of different memory states;
   a plurality of bitlines coupled with the memory cells;
   access circuitry coupled with the bitlines and configured to apply a program signal having a first voltage to one of the bitlines which is configured to apply the program signal to one of the memory cells to change the one memory cell from a first of the memory states to a second of the memory states; and
   wherein the access circuitry is configured to provide a second voltage to the bitlines which are immediately adjacent to the one bitline during the application of the program signal to the one memory cell, wherein the second voltage is different than the first voltage.

2. The memory system of claim 1 wherein the memory cells individually comprise a memory element between first and second electrodes.

3. The memory system of claim 2 wherein the one bitline is coupled with the first electrode of the one memory cell and the second voltage is provided to the second electrode of the one memory cell during the application of the program signal to the one memory cell.

4. The memory system of claim 2 wherein the access circuitry comprises a plurality of first switching devices configured to selectively couple the bitlines with the first electrodes of respective ones of the memory cells, and the second electrodes of the memory cells are coupled with a common conductor.

5. The memory system of claim 4 wherein the access circuitry comprises a plurality of second switching devices configured to selectively couple the bitlines which are immediately adjacent to the one bitline with the common conductor to provide the second voltage to the bitlines which are immediately adjacent to the one bitline during the application of the program signal to the one memory cell.

6. The memory system of claim 4 wherein the access circuitry comprises a plurality of second switching devices configured to selectively couple respective ones of the bitlines with the common conductor.

7. The memory system of claim 1 wherein the memory cells are individually configured to have a plurality of different electrical resistances corresponding to the different memory states of the individual memory cell.

8. The memory system of claim 1 wherein the access circuitry is configured to provide another program signal having a third voltage which is different than the first and second voltages to the one memory cell before the application of the program signal having the first voltage to the one bitline.

9. The memory system of claim 1 further comprising sense circuitry coupled with the bitlines, and wherein the sense circuitry is configured to use only a signal conducted via another of the bitlines to indicate the memory state of another of the memory cells coupled with the another bitline.

10. The memory system of claim 2 further comprising a conductive plate which comprises the first electrode of each of the memory cells, and wherein the bitlines are selectively coupled with respective ones of the second electrodes of the memory cells.

11. The memory system of claim 2 further comprising a conductive plate which is coupled with the first electrode of each of the memory cells, and wherein the bitlines are selectively coupled with respective ones of the second electrodes of the memory cells.

12. The memory system of claim 2 wherein a substantially zero voltage potential is provided across the memory element of each of the memory cells which are coupled with the bitlines which are immediately adjacent to the one bitline during the application of the program signal to the one memory cell.

* * * * *